United States Patent [19]

Ono

[11] Patent Number: 4,751,473

[45] Date of Patent: Jun. 14, 1988

[54] FET AMPLIFIER CIRCUIT

[75] Inventor: Tomohiko Ono, Kanagawa, Japan

[73] Assignee: Mitsubishi Denki Kabushiki Kaisha, Tokyo, Japan

[21] Appl. No.: 924,631

[22] Filed: Oct. 29, 1986

[30] Foreign Application Priority Data

Nov. 5, 1985 [JP] Japan ................................ 60-247784
Jul. 1, 1986 [JP] Japan ........................... 61-101119[U]
Jul. 1, 1986 [JP] Japan ........................... 61-101123[U]

[51] Int. Cl.$^4$ .......................... H03F 3/16; H02H 7/20
[52] U.S. Cl. .................................... 330/277; 330/294; 330/298
[58] Field of Search ............... 330/277, 298, 294, 107, 330/207 P

[56] References Cited

U.S. PATENT DOCUMENTS 4,420,724 12/1983 Owen ................................. 330/277

OTHER PUBLICATIONS

Tajima, Yusuke et al., "Design of Broad Band Power GaAs FET" IEEE Trans. on Microwave Theory and Techniques, vol. MTT-32, No. 2, Mar. 1984, pp. 261-267.

Aubert, D. et al., "Channel & Power Amplifiers for Communications Sattellite Applications", Microwave Systems Applications Technology Conference Proceedings, Mar. 8-10, 1983, pp. 269-307.

Primary Examiner—Gene Wan
Attorney, Agent, or Firm—Wolf, Greenfield & Sacks

[57] ABSTRACT

An FET amplifier circuit is provided capable of minimizing the phase change of signals which pass through the circuit. Further, an FET amplifier circuit is provided capable of protecting the circuit against the effects of over-amplitude input signals with the phase change minimized.

8 Claims, 3 Drawing Sheets

FET AMPLIFIER CIRCUIT

BACKGROUND OF THE INVENTION

1. Field of the Invention

This invention relates to an FET (Field Effect Transistor) amplifier circuit capable of compensating for the change in phase and/or magnitude of a signal passing through the circuit and an FET amplifier circuit also capable of protecting the circuit against over-amplitude or over-voltage signals applied thereto.

2. Description of the Prior Art

Referring to FIG. 1, there is shown the general arrangement of an FET amplifier circuit in the prior art, wherein reference numeral 1a, 1b and 1c denote a unity amplifier using FET, and numerals 2 and 3 denote an input terminal and an output terminal, respectively.

As is known in the art, FET amplifiers which are in particular intended for amplifying microwave signals with large amplitude have been getting increasingly useful because of their advantages in comparison with traveling-wave tube amplifiers. Such advantages include, for example, the fact that distortion is made lower by virtue of low phase shift and unsaturation characteristics, the reliability is high by using solid-state devices, the size is small, and the weight is light. These advantages are effective particularly in a satellite communication system using microwaves.

However, the FET amplifiers of the prior art involve some disadvantages. That is, the power dissipation depends on the power-added efficiency of an amplifier which processes high-level microwave signals. It is necessary for the FET amplifier to operate in low power dissipation conditions, that is, in a highly efficient state. As a result, the linearity of the amplifier must be sacrificed. This sacrifice of linearity causes a deterioration in the distortion and phase-change characteristics.

FIG. 2 shows phase-change and output amplitude characteristics versus relative input power to the FET amplifier. It is seen that the relative output power gets saturated as the relative input power increases and the amount of phase-change remarkably increases as the linearity of the amplifier is lost.

FET amplifiers often include means for protecting the amplifiers against the effect of over-amplitude input signals. FIG. 3 is a schematic diagram showing an exemplary prior art FET amplifier having protection against the effect of over-amplitude signals. In FIG. 3, the amplifier includes an FET 21 having a gate and a drain electrodes connected to an input matching circuit 22a and an output matching circuit 22b, respectively. The gate and drain electrodes are provided with bias circuits 23a and 23b, respectively, which supply those electrodes with direct-current bias and prevent the applied signals from flowing to a gate bias terminal 24 and a drain bias terminal 25 through which the direct-current biases are applied. A PIN diode 26 is connected to the amplifier in parallel for the purpose of limiting the amplitude of signals applied to the input matching circuit 22a. The PIN diode 26 is provided with direct-current bias from a bias circuit 27 which functions in a manner similar to the bias circuits 23a and the direct-current bias is applied through a diode bias terminal 28. In addition, blocking capacitors 29a, 29b and 29c are connected so as to block the flow of bias current for the FET 21 and the PIN diode 26 towards other elements while allowing signal components to pass. The signals are supplied to an input terminal 30 and are amplified by the FET 21 and then supplied from an output terminal 31. If a signal source connected to the input terminal 30 is broken down or an erroneous operation is performed, undesired over-amplitude signals may be applied to the input terminal 30.

In this case, if the over-large signal is applied to the gate electrode of the FET 21, a breakdown may be caused between the gate and source electrodes or the gate and drain electrodes of the FET 21 to result in the destruction of the FET 21. In order to prevent such destruction, the PIN diode 26 has conventionally been connected in parallel to the input side of the amplifier so as to limit the amplitude of the applied signal by using the saturation of the PIN diode 26. In addition, since the amplitude limited by the PIN diode 26 can be controlled by applying direct-current bias to the terminal 28 of the diode, such a PIN diode has often been employed for protecting the amplifier against over-large signals or keeping the linearity of the amplifier, in particular in power amplifier circuits.

Such FET amplifiers having a protector in the prior art bring about some problems. That is, it is necessary for the PIN diode 26 to be saturated in order to limit the amplitude of input signals, but the saturation characteristic thereof is not sharp enough, and therefore the limiting action is not sufficient, in particular when input signals vary over a wide range such as to go beyond the permissible limit of the FET 21 because of the gradual increase in the amplitude of the signals passing through the FET 21. Accordingly, it is essential for the saturation level of the PIN diode 26 to leave a substantial margin for any expectedly high level of the input signals. As a result, the capacity of the linearity of the amplifiers is not fully exercised and the range of linear operation is made narrow. Further, since the PIN diode 26 varies the phase of signals passing therethrough when it is saturated, a problem is experienced by the fact that the phase distortion increases as the amplitude of the input signals is changed, this problem being serious when the amplifier is used in a communication system.

Furthermore, the change in impedance of the PIN diode 26 caused by the saturation thereof varies the input matching condition and affects the frequency characteristics and the input-output behavioral characteristics.

SUMMARY OF THE INVENTION

In view of the foregoing problems in the prior art, it is an object of the invention to provide a highly efficient FET amplifier circuit while at the same time preventing the phase change caused by saturation of the FET amplifier.

Another object of the invention is to provide an FET amplifier circuit with a function of protecting against the effects of over-amplitude input signals, the amplifier being capable of providing sharp limiting operation relative to the method of the prior art without sacrificing the linearity and being capable of suppressing the phase change of the applied signals even if the level of the input signals is changed.

In accordance with the present invention, an FET amplifier circuit is provided comprising a PIN diode phase shifter disposed serially in the input stage of a multistage amplifier and a control circuit for controlling the phase of the phase shifter on the basis of a signal obtained from one of the stages.

With such arrangement, the phase shifter serially connected to an FET amplifier adjusts the phase in accordance with the phase change when the amplifier is saturated.

In accordance with another aspect of the present invention, there is provided an FET amplifier circuit comprising a second amplifier using a dual gate FET, the second amplifier being connected to a first conventional multistage amplifier and a control circuit for controlling the phase of the second amplifier, a signal being picked up from one of the stages and applied to the second amplifier through the control circuit.

With such arrangement, the second amplifier serially connected to the first conventional multistage amplifier accomplishes the phase adjustment on the basis of the phase change caused by the saturation of the FET amplifier.

In accordance with yet another aspect of the present invention, an FET amplifier circuit is provided wherein the PIN diode (26) of the prior art disposed at the input side of the FET (21) for the purpose of limiting input signals is replaced by an active PIN diode attenuator.

With such arrangement, rapidly applied protection against over-large input signals while suppressing the phase change of the input signals is attained by taking advantage of the fact that a gate current flows to the gate electrode of an FET in proportion to an input signal level when an FET amplifier is saturated and providing a detection resistor with such gate current to use the voltage drop across the resistor as a control voltage for the PIN diode attenuator.

BRIEF DESCRIPTION OF THE DRAWINGS

The foregoing features and other aspects of the invention are explained in the following detailed description taken in connection with the accompanying drawings wherein.

DESCRIPTION OF THE PREFERRED EMBODIMENTS

Figure 1:
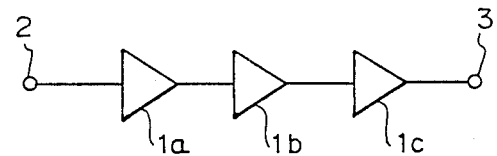
FIG. 1 is a schematic diagram showing the general arrangement of an FET amplifier circuit in the prior art.
Figure 2:
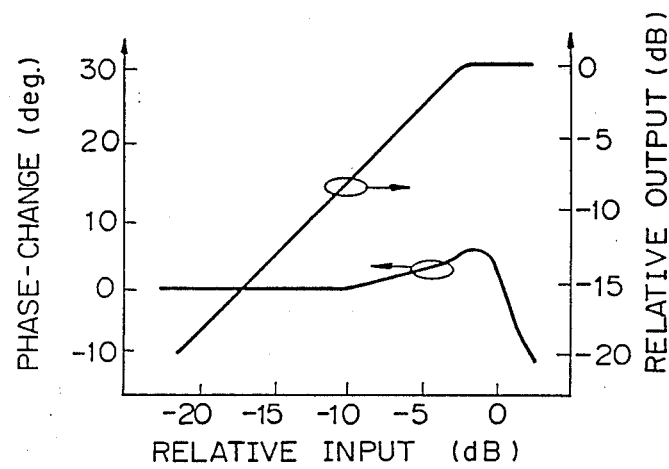
FIG. 2 is a graph illustrating phase-change and output amplitude characteristics of a conventional FET amplifier circuit.
Figure 4:
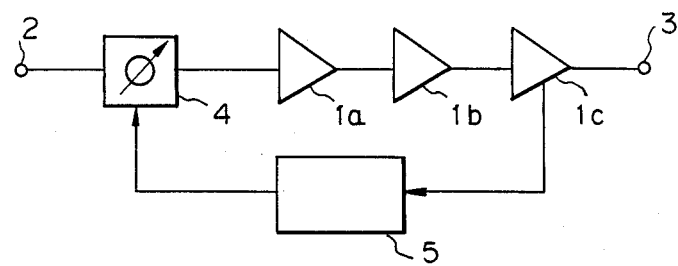
FIG. 4 is a block diagram of an embodiment according to the present invention.

Referring now to FIG. 4, there is shown an embodiment of an FET amplifier circuit according to the invention. In FIG. 4, reference numerals 1a, 1b and 1c denote the same elements as those in FIG. 1 which shows an FET amplifier circuit of the prior art. In accordance with the invention, as shown, a PIN diode phase shifter 4 is connected in serial and a control circuit 5 is disposed for controlling the phase shifter 4 in response to a signal obtained from a unity amplifier 1c.

Figure 5:
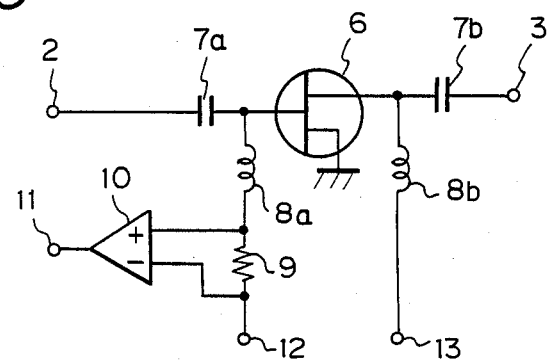
FIG. 5 is a schematic diagram of a unity amplifier 1c included in the amplifier circuit shown in FIG. 4.

FIG. 5 is a more detailed schematic diagram of the unity amplifier 1c shown in FIG. 4 wherein an input terminal 2 and an output terminal 3 correspond to those shown in FIG. 4 while components disposed between the terminal 2 and the unity amplifier 1c are not shown. In FIG. 5, blocking capacitors 7a and 7b block the flow of dc-bias towards undesired portions, and choke coils 8a and 8b prevent a signal component from flowing towards bias circuits (not shown) which are coupled to respective gate and drain bias terminals 12 and 13. A resistor 9 is interposed between the choke coil 8a and the gate bias terminal 12 to detect the phase change produced in an FET 6. The dc-signal detected by the resistor 9 is applied to a differential amplifier 10 and then fed to the control circuit 5 through a terminal 11.

Figure 6:
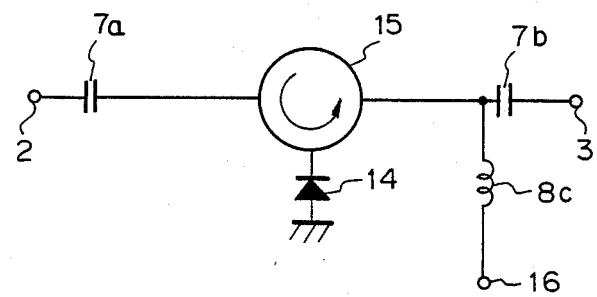
FIG. 6 is a schematic diagram of a PIN diode phase-shifter 4 shown in FIG. 4.

Referring now to FIG. 6, there is shown in more detail the constitution of the PIN diode phase shifter 4. In FIG. 6, terminals 2 and 3 and capacitors 7a and 7b correspond to the components given the same reference numerals in FIG. 5, while a coil 8c is similar to the choke coils 8a and 8b shown in FIG. 5. A PIN diode 14 is connected to a circulator 15, as shown, which rotate an incoming microwave signal in a predetermined direction. To a terminal 16, a control signal from the control circuit 5 is applied to control the PIN diode 14. Although the control circuit 5 is not shown in great detail, the signal detected by the resistor 9 through the differential amplifier 10 and terminal 11 is modified to take a suitable form for controlling the phase shifter 4.

In operation, the FET 6 of the unity amplifier 1c starts to get saturated as input power fed to the input terminal 2 increases. Here, it is noted that the gate current in the forward or backward direction generally flows in proportion to the degree of saturation of the FET 6. The gate current can be detected by the resistor 9 as dc-voltage. Thus, the voltage appearing across the resistor 9 increases in proportion to the degree of saturation of the FET 6 or the phase change of the signal in the FET 6. As a result, the total amount of phase change of the FET amplifier is made zero by supplying the PIN diode phase shifter 4 with the detected voltage from the differential amplifier 10 through the control circuit 5 to cause the phase shifter to produce a phase change which is the same amount as the phase change in the FET 6 but reverse in polarity. The phase change given when the signal passes from the input terminal 2 to the output terminal 3 is controlled by changing the conduction state of the PIN diode 14 on the basis of the voltage applied to the terminal 16 through the control circuit 5.

As explained above, in accordance with the invention, the total phase change of the FET amplifier is substantially decreased by detecting the change in gate current of the FET in the amplifier and controlling the PIN diode phase shifter in response to the detected change.

Figure 7:
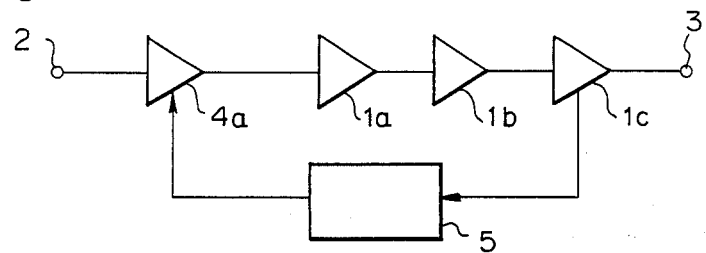
FIG. 7 is a block diagram of another embodiment according to the present invention.

FIG. 7 is a block diagram of another embodiment of the invention. All the components in FIG. 7 are the same as those in FIG. 4 except for a second amplifier 4a. The second amplifier 4a is connected to the first conventional amplifier 1 (1a, 1b and 1c) and is constructed of a dual gate FET. The unity amplifier 1c is constituted as shown in FIG. 5 and operates in the manner described in connection with FIG. 5.

Figure 8:
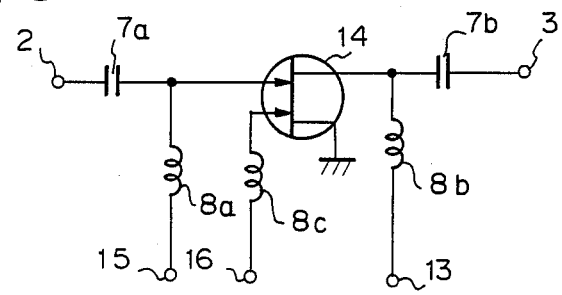
FIG. 8 is a schematic diagram of a second amplifier 4a shown in FIG. 7.

FIG. 8 is a schematic diagram showing in more detail the construction of the second amplifier 4a shown in FIG. 7. All the components are the same as those shown in FIG. 6 except for a dual gate FET 14. The dual gate FET 14 has a first gate electrode connected to the input terminal 2 through the capacitor 7a and a second gate electrode which is provided with the control signal from the control circuit 5 through the terminal 16.

Since the operation of the FET amplifier shown in FIGS. 7 and 8 is similar to that shown in FIGS. 4, 5 and 6, it is not necessary to explain this in detail for those skilled in the art. The second amplifier 4a is capable of changing the phase of the signal between the input terminal 2 and the output terminal 3 in accordance with the voltage applied to the terminal 16. Such type of amplifier is widely used as an infinite phase shifter.

The FET amplifier shown in FIGS. 7 and 8 also makes the total phase change zero by supplying the second amplifier 4a with the control signal from the control circuit 5 to cause the amplifier 4a to produce a phase change which is the same in amount as the phase change in the FET 6 but reverse in polarity. In addition, since the second amplifier 4a has an amplification function, it can be used as a signal gain-controlling amplifier.

Figure 3:
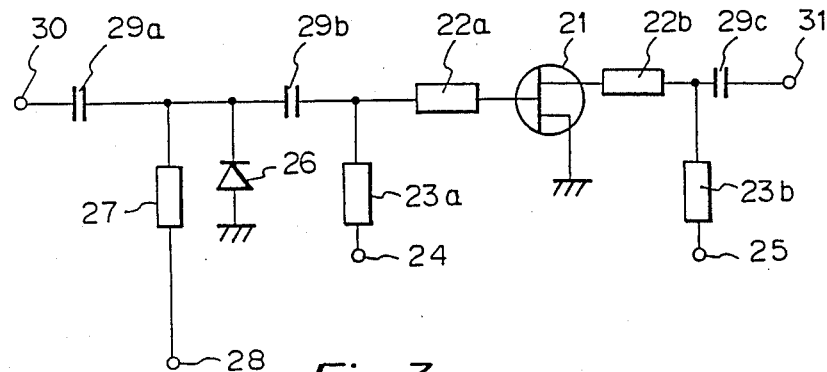
FIG. 3 is a schematic diagram of an exemplary prior art FET amplifier with protection against over-large input signals.
Figure 9:
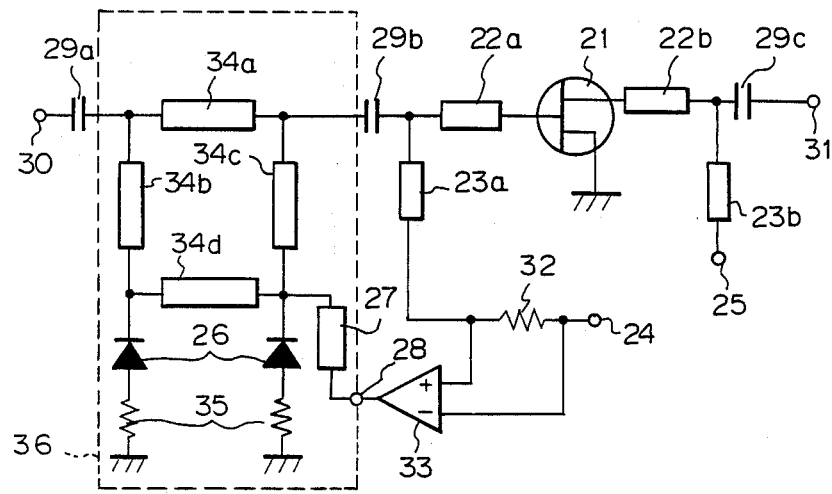
FIG. 9 is a schematic diagram of yet another embodiment according to the present invention.

Referring now to FIG. 9, there is shown yet another embodiment according to the invention, where reference numerals 21 through 31 denote the same element as those in FIG. 3. In FIG. 9, a detection resistor 32 is connected in series between the gate bias terminal 24 and the bias circuit 23a to detect the gate current when over-large input is supplied and a differential amplifier 33 produces a control voltage in response to the detected voltage from the resistor 32. Matched lines 34a, 34b, 34c, 34d, terminal resistors 35 and PIN diodes 26 form a PIN diode attenuator 36.

With such arrangement, when the level of input signal to the FET 21 reaches a saturation region, a gate current flows to the gate electrode in accordance with the input level to generate a voltage drop across the resistor 32. The differential amplifier 33 produces a control signal suitable for control of the PIN diode attenuator 36. Thus, the amount of attenuation by the attenuator 36 may be freely selected, whereby the input to the amplifier is kept at a desirable level.

In accordance with the present invention, since the FET 21 is kept within a predetermined degree of saturation, that is, the amplifier operates at full capacity of linearity, the action of limiting input signals is very sharp. In addition, since the PIN diode attenuator 36 is not operated any more than need be, the problem of phase distortion is also overcome.

Furthermore, since the impedance characteristics stay constant regardless of the change in attenuation by the PIN diode attenuator 36, the frequency characteristics and the input-output behavioral characteristics of the amplifier are not affected.

As mentioned above, reliable protection against the effects of over-large input is attained with the linearity of the amplifier effectively utilized and the capacity of the FET fully exercised by controlling the PIN diode attenuator on the basis of the voltage which is obtained from the gate current flowing through the FET.

Having described preferred embodiments of the invention, it will be apparent to those skilled in the art that many changes and modifications may be made without departing from the concepts of the invention.

What is claimed is:

1. In a amplifier circuit having at least one FET, circuit means for controlling the phase of signals passing through said amplifier circuit, said circuit means comprising, means coupled to said FET to change the phase of signals coupled thereto and including a phase control terminal, means for detecting the power fed to the input electrode of the FET, and feedback means coupled from said means for detecting to said means to change the phase for generating a control signal coupled to said phase control terminal for altering the phase in an opposite sense to and as a function of the power detected.

2. An FET amplifier circuit comprising:
   a multistage amplifier having an FET;
   means for detecting the power fed to the input electrode of the FET of one of the stages of said multistage amplifier, means coupled to said multistage amplifier at a location before said one stage for changing the phase of signal passing therethrough in proportion to the voltage of a control signal; and
   feedback means coupled from means for detecting to said means for changing phase for providing said control signal, said control signal controlling said means for changing phase so as to minimize phase change of signals passing through the circuit.

3. An FET amplifier circuit as set forth in claim 2 wherein said feedback means includes means controlling phase in inverse proportion to the signal detected at said input electrode of the FET.

4. An FET amplifier circuit as set forth in claim 2 wherein said feedback means includes means for providing a voltage signal detected by said power detecting means with the polarity reversed, whereby the total phase change of the multistage amplifies is substantially decreased.

5. An FET amplifier circuit as set forth in claim 2 wherein said phase changing means comprises a PIN diode phase shifter.

6. An FET amplifier circuit as set forth in claim 2 wherein said phase changing means comprises a second amplifier using a dual gate FET.

7. An FET amplifier circuit as set forth in claim 2 wherein said control signal from the amplifier is obtained from a resistor through which the gate current of said FET flows.

8. An FET amplifier circuit with protection against over-amplitude input signals, comprising:
   an FET amplifier having an FET and an input-output circuit, said input-output circuit including matching circuits coupled to gate and drain electrodes of the FET and a bias circuit.
   a PIN diode attenuator connectd to the FET amplifier on the gate electrode said thereof, the amount attenuation provided by said attenuator being proportional to a diode controlling voltage;
   a gate current detecting resistor connected to the bias circuit on the gate electrode side of the FET; and
   a control circuit for providing the PIN diode attenuator with the detected voltage generated across the resistor as said diode controlling voltage.

* * * * *